United States Patent
Usui et al.

(10) Patent No.: US 7,105,384 B2
(45) Date of Patent: Sep. 12, 2006

(54) CIRCUIT DEVICE MANUFACTURING METHOD INCLUDING MOUNTING CIRCUIT ELEMENTS ON A CONDUCTIVE FOIL, FORMING SEPARATION GROOVES IN THE FOIL, AND ETCHING THE REAR OF THE FOIL

(75) Inventors: Ryosuke Usui, Aichi (JP); Hideki Mizuhara, Aichi (JP); Yusuke Igarashi, Gunma (JP); Noriaki Sakamoto, Gunma (JP)

(73) Assignees: Sanyo Electric Co., Ltd, Osaka (JP); Kanto Sanyo Semiconductors Co., Ltd., Gunma (JP)

( * ) Notice: Subject to any disclaimer, the term of this patent is extended or adjusted under 35 U.S.C. 154(b) by 0 days.

(21) Appl. No.: 10/724,954

(22) Filed: Dec. 1, 2003

(65) Prior Publication Data

US 2004/0152241 A1 Aug. 5, 2004

(30) Foreign Application Priority Data

Dec. 4, 2002 (JP) .......................... P.2002-352140

(51) Int. Cl.
H01L 21/44 (2006.01)
H01L 21/48 (2006.01)
H01L 21/50 (2006.01)

(52) U.S. Cl. .................. 438/124; 438/617; 438/665; 438/670

(58) Field of Classification Search ............... 438/124, 438/617, 665, 670; 174/260, 261
See application file for complete search history.

(56) References Cited

U.S. PATENT DOCUMENTS

| 3,541,379 A | * | 11/1970 | Holden ................ 315/111.01 |
| 5,635,671 A | * | 6/1997 | Freyman et al. ........... 174/52.2 |
| 5,675,177 A | * | 10/1997 | Abys et al. ................. 257/666 |
| 5,807,787 A | | 9/1998 | Fu et al. ..................... 438/623 |
| 5,909,633 A | | 6/1999 | Haji et al. .................. 438/612 |
| 6,074,895 A | * | 6/2000 | Dery et al. ................. 438/108 |
| 6,083,775 A | * | 7/2000 | Huang et al. ............... 438/118 |
| 6,096,649 A | | 8/2000 | Jang .......................... 438/687 |
| 6,338,980 B1 | | 1/2002 | Satoh ........................ 438/106 |
| 6,383,893 B1 | | 5/2002 | Begle et al. ............... 438/460 |
| 6,406,991 B1 | | 6/2002 | Sugihara ................... 438/613 |
| 6,512,295 B1 | | 1/2003 | Gaynes et al. ............. 257/738 |
| 6,528,879 B1 | * | 3/2003 | Sakamoto et al. ......... 257/729 |
| 6,596,559 B1 | | 7/2003 | Kodnani et al. ........... 438/106 |
| 6,602,803 B1 | | 8/2003 | Yew et al. ................. 438/780 |
| 6,689,641 B1 | | 2/2004 | Ohta et al. ................. 438/121 |

(Continued)

FOREIGN PATENT DOCUMENTS

JP 10-242097 9/1998

(Continued)

*Primary Examiner*—William M. Brewster
(74) *Attorney, Agent, or Firm*—Fish & Richardson P.C.

(57) ABSTRACT

A circuit device manufacturing method is provided, wherein contaminants attached to the top surfaces of conductive patterns 21 are removed using plasma to thereby improve the adhesion of conductive patterns 21 to a sealing resin 28. By selective etching of a conductive foil 10, separation grooves 11 are formed, thereby forming conductive patterns 21. A semiconductor element 22A and other circuit elements are mounted onto desired locations of conductive patterns 21 and electrically connected with conductive patterns 21. By irradiating plasma onto conductive foil 10 from above, contaminants attached to the surfaces of separation grooves 11 are removed.

13 Claims, 8 Drawing Sheets

U.S. PATENT DOCUMENTS

| | | | |
|---|---|---|---|
| 6,713,376 B1 | 3/2004 | Sugihara | 438/613 |
| 6,889,428 B1 * | 5/2005 | Igarashi et al. | 29/832 |
| 2002/0106831 A1 | 8/2002 | Tago et al. | 438/108 |
| 2004/0006869 A1 | 1/2004 | Igarashi et al. | 29/847 |
| 2004/0152234 A1 | 8/2004 | Usui et al. | 438/106 |
| 2004/0234703 A1 | 11/2004 | Frautschi | 427/535 |

FOREIGN PATENT DOCUMENTS

| | | |
|---|---|---|
| JP | 10-270476 | 10/1998 |
| JP | 2002-076246 | 3/2002 |
| JP | 2002-110721 | 4/2002 |
| JP | 2002-280488 | 9/2002 |

* cited by examiner

CIRCUIT DEVICE MANUFACTURING METHOD INCLUDING MOUNTING CIRCUIT ELEMENTS ON A CONDUCTIVE FOIL, FORMING SEPARATION GROOVES IN THE FOIL, AND ETCHING THE REAR OF THE FOIL

BACKGROUND OF THE INVENTION

1. Field of the Invention

This invention relates to a circuit device manufacturing method and particularly relates to a circuit device manufacturing method wherein plasma is irradiated onto a conductive foil to remove residues attached to the top surface of the conductive foil.

2. Description of the Related Art

Due to being employed in portable telephones, portable computers, etc., circuit devices that are set in electronic equipment have been demanded since priorly to be compact, thin, and lightweight. In order to meet such demands, semiconductor devices called CSP's (Chip Size Packages), which are equivalent or slightly larger in size to a chip, have been developed. However, with a general type of CSP, a supporting substrate, such as a glass epoxy substrate, ceramic substrate, etc., was required as an essential component for supporting the entire device. Since the supporting substrate is a thick member, the overall size of the semiconductor device tended to be large.

In view of the above problem, a circuit device, with which a supporting substrate is made unnecessary, has been developed. A method for manufacturing such a circuit device shall now be described.

Figure 10A:
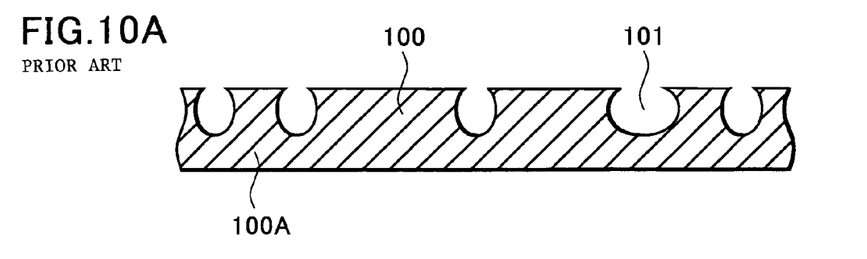

As shown in FIG. 10(A), a conductive foil 100, formed of copper or other metal, is prepared and conductive patterns 100A are formed so as to realize predetermined electrical circuits. A known etching process using an etch resistant mask may be carried out as the method of forming separation grooves.

Figure 10B:
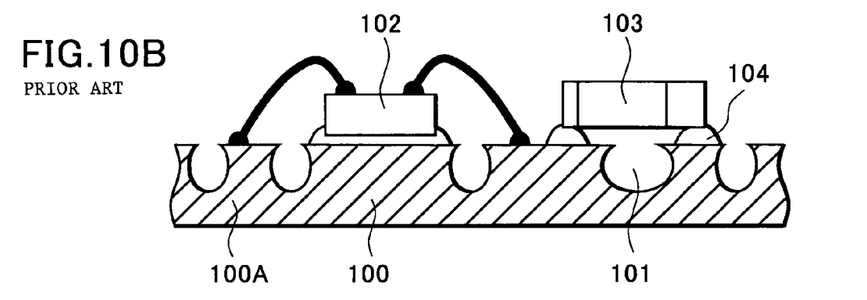

Referring to FIG. 10(B), circuit elements are affixed onto the top surfaces of conductive patterns 100A. As the circuit elements, chip elements 103, such as capacitors, resistors, etc., and semiconductor elements 102, etc., are affixed. Furthermore, the electrodes of semiconductor elements 102 are electrically connected to conductive patterns 100A via metal wires.

Figure 10C:
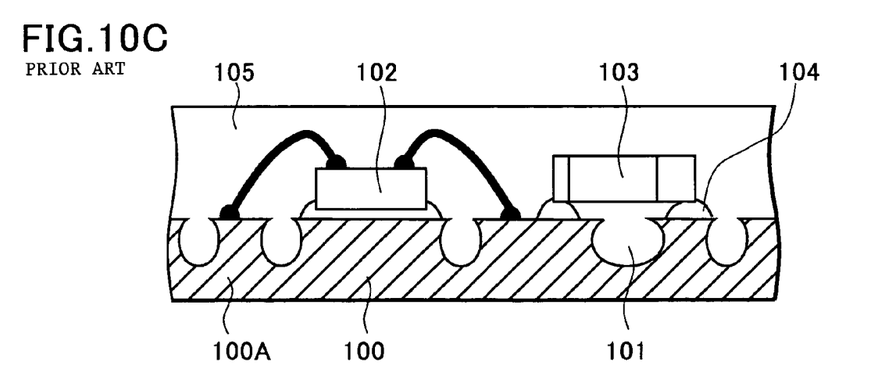

Referring to FIG. 10(C), covering by a sealing resin 105 is carried out. The circuit elements that were affixed in the prior step are covered and sealing resin 105 fills separation grooves 101 of conductive foil 100 as well.

Figure 10D:
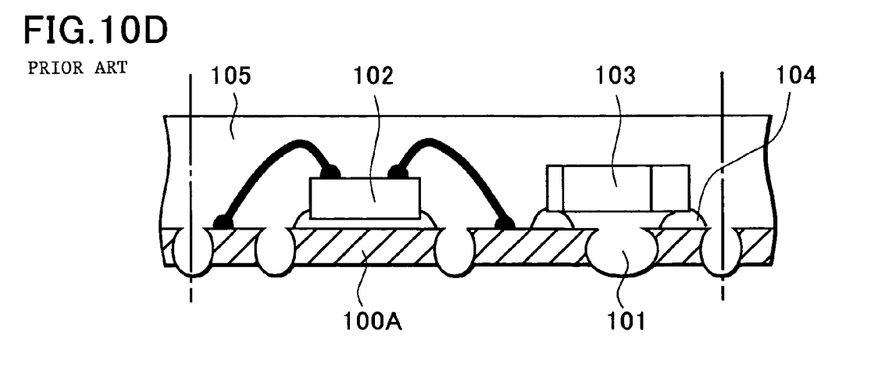

Referring to FIG. 10(D), conductive foil 100 is etched from the rear surface and conductive foil 100 is thereby removed until the sealing resin 105 that fills separation grooves 101 becomes exposed. The respective conductive patterns 100A are thereby separated electrically. Forming of a solder resist, forming of external electrodes, etc., are then performed. Lastly, by dicing sealing resin 105 at locations indicated by the alternate long and short lines, the respective circuit devices are separated. A circuit device, which does not require a supporting substrate, was manufactured by processes such as the above.

Figure 11A:
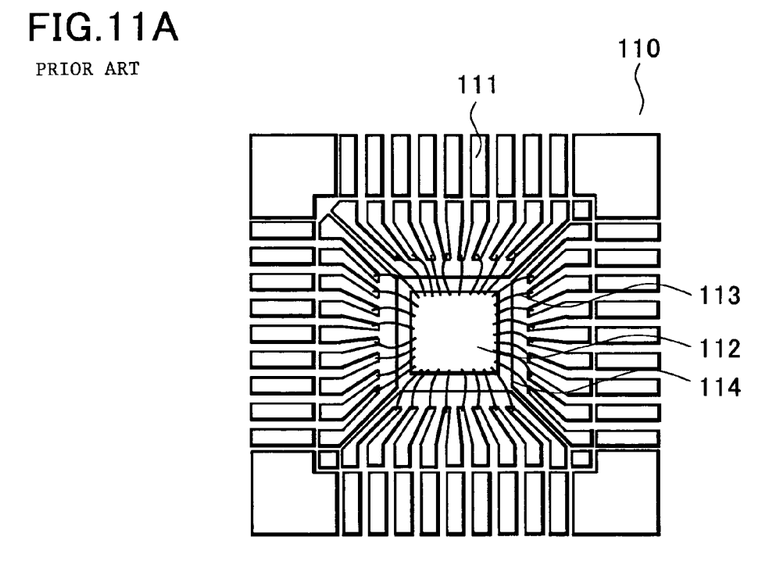
Figure 11B:
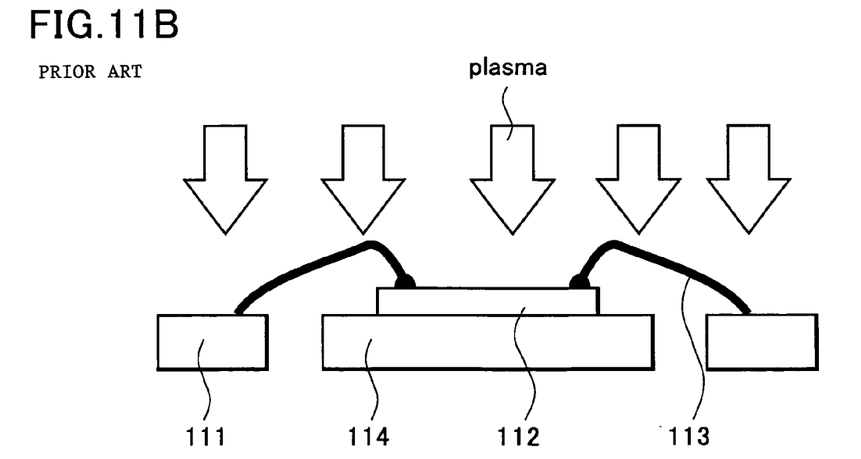

As an art for removing contaminants attached to the top surfaces of patterns formed of metal, there is the art of plasma irradiation. A method of irradiating plasma onto a lead frame, on which a semiconductor element is mounted, to remove contaminants attached to the top surface shall now be described with reference to FIG. 11.

The configuration of a lead frame 110, which has been subject to a lead frame processing step, an element mounting step, etc., shall now be described with reference to FIG. 11(A). A semiconductor element 112 is mounted onto an island 114, which has been formed to a land form, and a plurality of leads 111 are disposed so as to surround island 114. Leads 111 correspond to electrodes provided on the top surface of semiconductor element 112 and the respective electrodes are electrically connected via metal wires 113 to leads 111.

The plasma irradiation step shall now be described with reference to FIG. 11(B). First, lead frame 110 is set in a sealed container. Gas is then introduced into the container and plasma gas is generated by a discharge. The top surface of lead frame 110 is cleaned by the collision of radicals or ions existing in the plasma gas with the top surface of lead frame 110.

However, with the above-described circuit device manufacturing method, there was the problem that the top surface of conductive foil 100 becomes contaminated due to the processes carried out prior to sealing by resin. Organic residues contained in the etchant used in the step of forming separation grooves 101, dust in the air, etc., are considered to be the contaminants. When sealing by sealing resin 105 is performed with such contaminants attached to the top surface of conductive foil 100, the force of attachment of sealing resin 105 to conductive foil 100 may decrease.

Also, with the method of cleaning a lead frame by plasma irradiation as shown in FIG. 11, since complex shapes are formed so as to form island 114 and leads 111, the plasma irradiation causes localized increases in electric potential to occur in lead frame 110. There was thus the problem of current flowing into semiconductor element 112 via metal wires 113 due to such localized potential differences in the lead frame and damaging a CMOS and other elements formed on the top surface of the semiconductor element. There was also the problem that, due to lead frame 110 becoming high in temperature in the plasma irradiation step, the leads become deformed and metal wires 113 become disconnected.

This embodiment of invention has been made in view of such problems and a main object of this embodiment of invention is to provide a circuit device manufacturing method, wherein cleaning and roughening of the top surface of a conductive foil is performed by irradiating plasma onto the top surface of the conductive foil. Another object of this embodiment of invention is to provide a circuit device manufacturing method that resolves the problems of breakage of a semiconductor element, etc., that occur in the process of removing contaminants attached to the top surfaces of conductive materials by use of plasma.

SUMMARY OF THE INVENTION

A method of preferred embodiment comprises the steps of forming separation grooves in a conductive foil from the top surface to form conductive patterns that are integrally connected at the bottom; mounting circuit elements onto desired locations of the conductive patterns; and sealing with a resin layer so as to cover the circuit elements and fill the separation grooves; wherein plasma is irradiated onto the top surface of the conductive foil. By irradiating plasma onto the top surface of the conductive foil, contaminants that are attached to the top surface of the conductive foil can be removed, and furthermore, the top surface of the conductive foil can be roughened to improve adhesion to the insulating resin.

Optimally, the plasma irradiation is carried out prior to the step of mounting the circuit elements. By performing plasma irradiation in the state in which circuit elements are not mounted onto the conductive foil, plasma irradiation can be performed across the entirety of the plasma foil. Plasma irradiation can thus be performed on regions of the conductive foil at which the mounting of circuit elements is planned and on regions of the separation grooves.

A method of preferred embodiment comprises the steps of: forming separation grooves in a conductive foil from the top surface to form conductive patterns that are integrally connected at the bottom; mounting circuit elements onto desired locations of the conductive patterns; irradiating plasma onto the top surface of the conductive foil, including the circuit elements; and sealing with a resin layer so as to cover the circuit elements and fill the separation grooves. Since the conductive patterns of this embodiment are connected at the bottom portion, localized potential differences will not occur in the plasma irradiation step and the breakage of semiconductor elements and other circuit elements can be restrained. Also, since the conductive patterns are integral as a conductive foil, there is little deformation due to heating in the plasma irradiation step. Deformation and disconnection of the metal wires that connect the circuit elements and the conductive patterns can thus be restrained.

Optimally, contaminants attached to the surfaces of the separation grooves are removed by the plasma. Since the irradiated plasma is reflected by the surfaces of the separation grooves, the cleaning effect is improved further by the reflected plasma. Also, the top surface of the conductive foil is roughened by the plasma irradiation and the adhesion of the conductive patterns to the insulating resin is there by improved.

With this embodiment, the top surface of a conductive foil can be cleaned and roughened by the irradiation of plasma onto the top surface of the conductive foil. Furthermore, the problems of breakage of semiconductor elements, etc., which occur in the process of using plasma to remove contaminants attached to the surface of a conductive material, can be resolved.

DESCRIPTION OF THE DRAWINGS

FIG. 1 is a sectional view (A) and a plan view (B) showing a circuit device manufacturing method of preferred embodiment.

FIG. 3 is a sectional view (A) and a plan view (B) showing a circuit device manufacturing method of preferred embodiment.

FIG. 5 is a sectional view (A), a sectional view (B), and a sectional view (C) showing a circuit device manufacturing method of preferred embodiment.

FIG. 6 is a sectional view (A) and a plan view (B) showing a circuit device manufacturing method of preferred embodiment.

FIG. 10 is a sectional view (A), a sectional view (B), a sectional view (C) and a sectional view (D) showing a related-art circuit device manufacturing method.

FIG. 11 is a plan view (A) and a sectional view (B) showing a related-art circuit device manufacturing method.

DETAILED DESCRIPTION OF THE PREFERRED EMBODIMENTS

A circuit device manufacturing method of preferred embodiment comprises the steps of forming separation grooves 11 in a conductive foil 10 from the top surface to form conductive patterns 21 that are integrally connected at the bottom; mounting circuit elements 22 onto desired locations of conductive patterns 21; and sealing with a sealing resin 28 so as to cover circuit elements 22 and fill separation grooves 11; and a circuit device is manufactured by irradiating plasma onto the top surface of conductive foil 10. There are two methods of plasma irradiation, and in a first method, plasma irradiation is carried out prior to the mounting of circuit elements 22, and in a second method, plasma irradiation is carried out subsequent the mounting of circuit elements 22. The details of the respective steps mentioned above shall now be described.

Figure 1A:
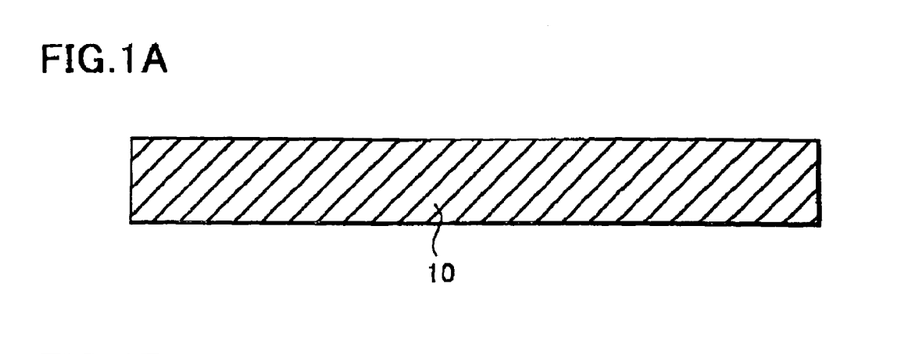
Figure 1B:
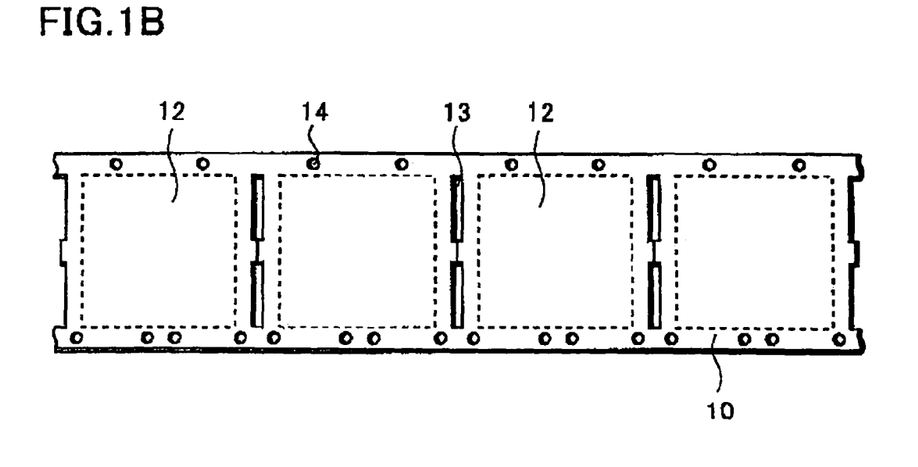
Figure 2:
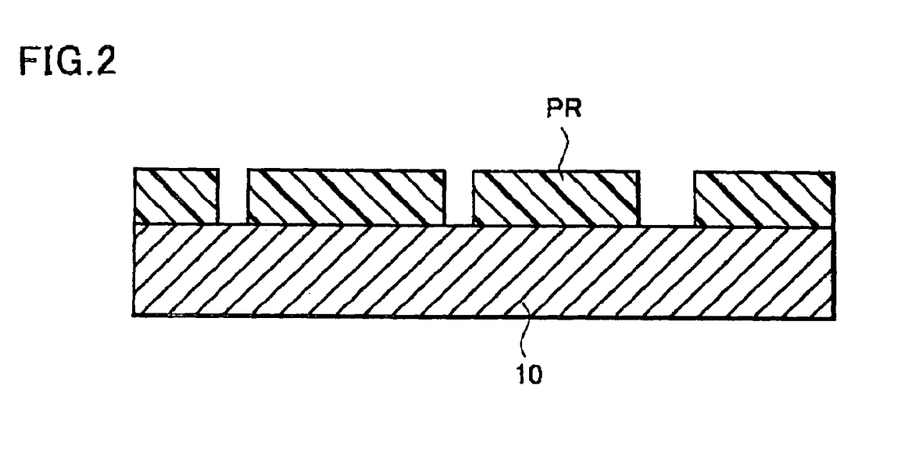
FIG. 2 is a sectional view showing a circuit device manufacturing method of preferred embodiment.
Figure 3A:
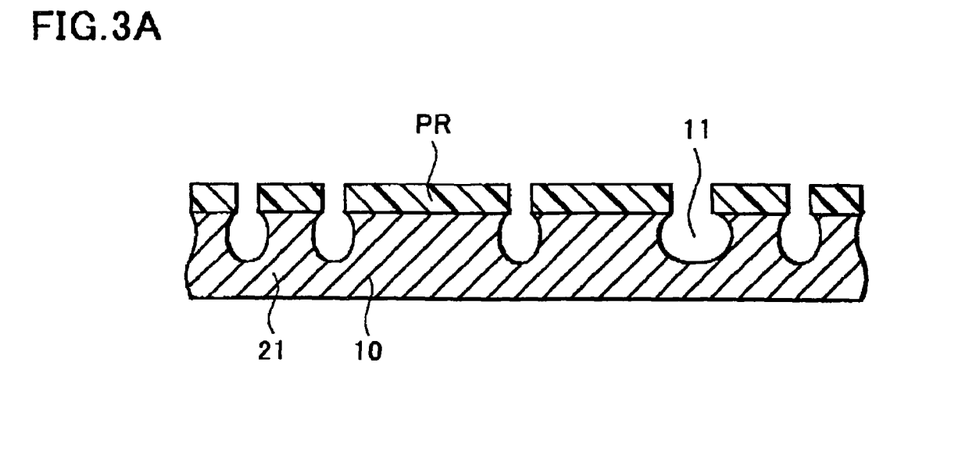
Figure 3B:
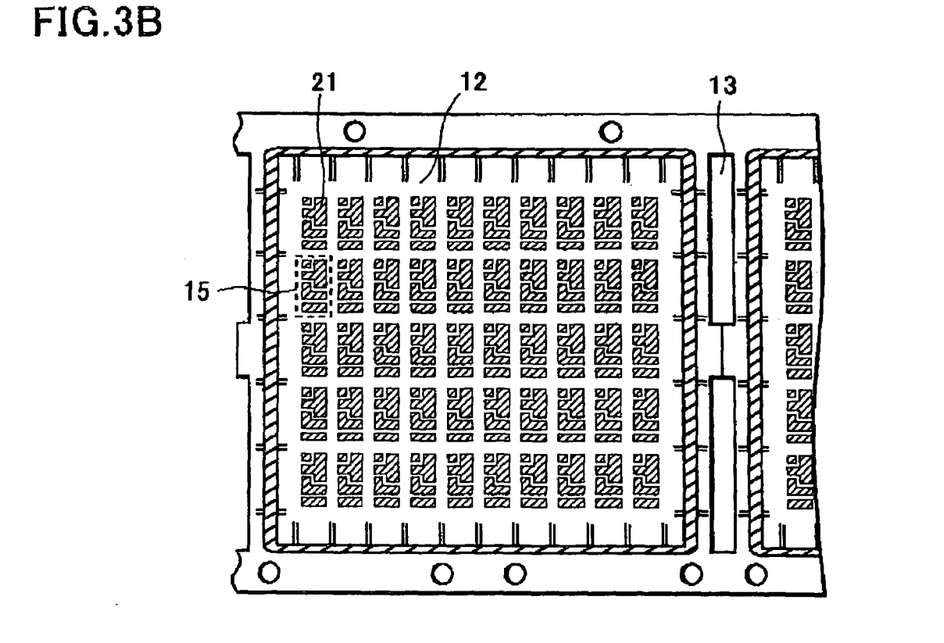

As shown in FIG. 1 to FIG. 3, in the first step of this embodiment, separation grooves 11 are formed in a conductive foil 10 from the top surface to form conductive patterns 21 that are integrally connected at the bottom of the conductive foil 10.

In this step, first, a sheet-form conductive foil 10 is prepared as shown in FIG. 1(A). The material of this conductive foil 10 is selected in consideration of solder material attachment property, bonding property, and plating property, and as this material, a conductive foil having Cu as the principal material, a conductive foil having Al as the principal material, or a conductive foil formed of an alloy, such as Fe—Ni, etc., is employed.

Concretely, as shown in FIG. 1(B), four to five blocks 12, on which a plurality of mounting parts will be formed, are aligned in as paced manner a long conductive foil 10 of strip-like form. Between each block 12 are provided slits 13 that absorb the stress that arises in conductive foil 10 in a heating process in the molding step, etc. Also, index holes 14 are provided at fixed intervals at the upper and lower peripheral edges of conductive foil 10 and these are used for positioning in the respective steps. Conductive patterns 21 are then formed in each block.

First, as shown in FIG. 2, a photoresist PR (etch resistant mask) is formed above conductive foil 10 and photoresist PR is patterned so that conductive foil 10 will be exposed at regions besides regions that are to become conductive patterns 21. Conductive foil 10 is then etched selectively via photoresist PR as shown in FIG. 3(A). Separation grooves 11 formed by etching are, for example, 50 μm in depth and since the side surfaces thereof are rough surfaces, the adhesion to sealing resin 28 is improved.

The structure of the side walls of separation grooves 11 differs according to the removal method. Wet etching, dry etching, vaporization by laser, or dicing may be employed in this removal step. In the case of wet etching, ferric chloride or cupric chloride is mainly employed as the etchant, and conductive foil 10 is dipped in this etchant or is showered with this etchant. Since generally with wet etching, etching is performed in a non-anisotropic manner, the side surfaces become curved structures.

Specific conductive patterns are shown in FIG. 3(B). In this figure, conductive patterns corresponding to one of blocks 12 shown in FIG. 1(B) is shown in enlarged manner. A region surrounded by dotted lines is one mounting part 15 in which conductive patterns 21 are formed, and on one block 12, a plurality of mounting parts 15 are aligned in the form of a matrix of five rows and ten columns, and the same conductive patterns 21 are formed in each mounting part 15.

Figure 4:
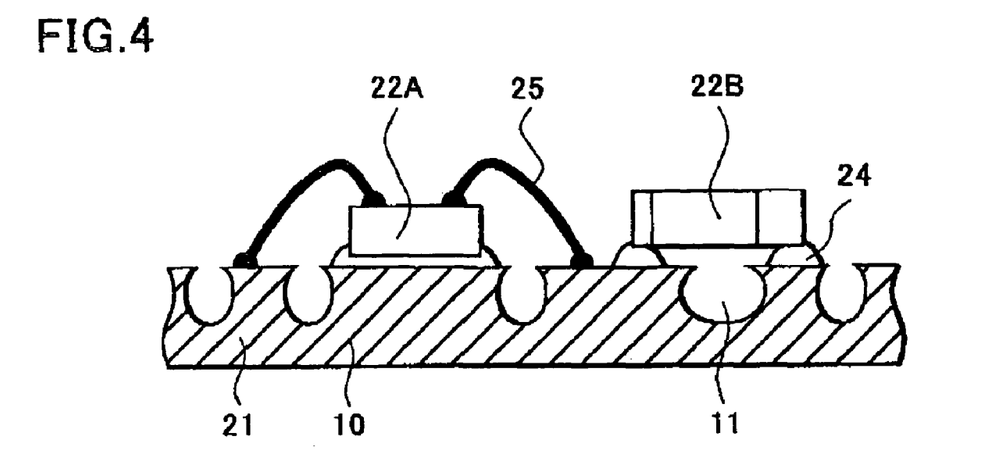
FIG. 4 is a sectional view showing a circuit device manufacturing method of preferred embodiment.

In the second step of this embodiment, circuit elements 22 are affixed onto desired locations of conductive patterns 21. Examples of circuit elements 22 include semiconductor elements, such as transistors, diodes, IC chips, etc., and passive elements, such as chip capacitors, chip resistors, etc. Though the thickness will be greater, face-down semiconductor elements, such as CSP's, BGA's, etc., may also be mounted.

Here, a bare semiconductor element 22A is die bonded to a conductive pattern 21 and the electrodes of semiconductor element 22A are electrically connected to conductive patterns 21 via metal wires. Also, 22B is a chip capacitor or other chip element that is a passive element, etc., and is affixed by a conductive paste, such as soft solder or other solder material 24, etc.

Figure 5A:
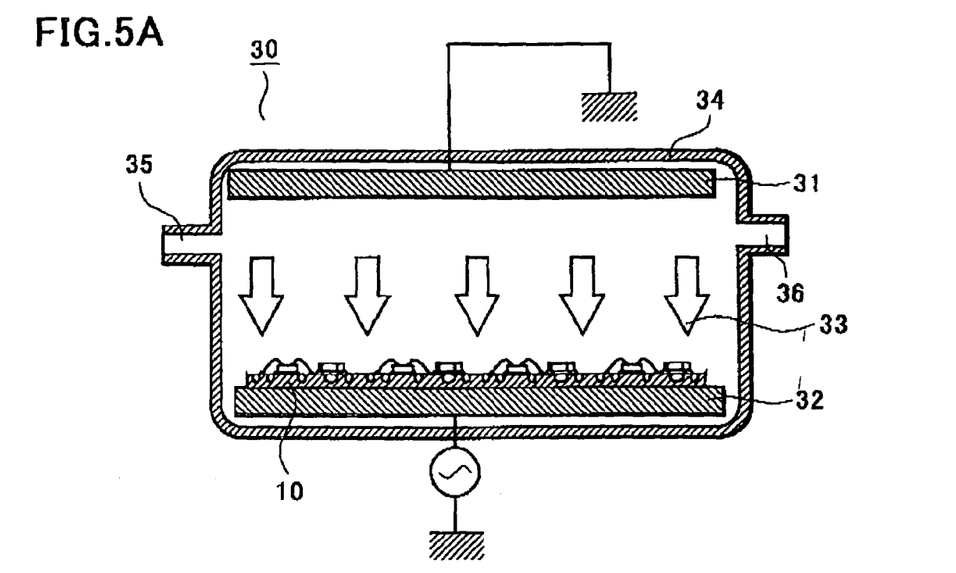
Figure 5B:
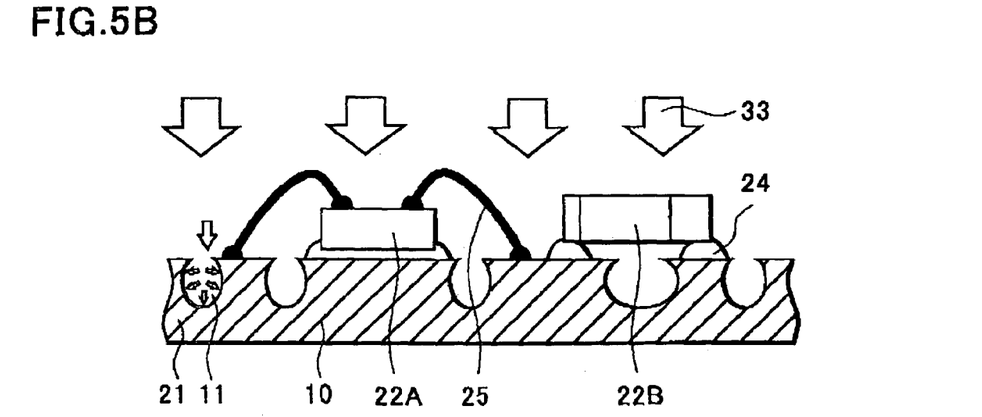

In the third step of this embodiment, the top surface of conductive foil 10 is cleaned along with circuit elements 22 by plasma irradiation as shown in FIG. 5. FIG. 5(A) is a diagram illustrating the plasma cleaning process in outline and FIG. 5(B) is a sectional view showing the manner in which plasma is irradiated onto a single mounting part 15.

The process of cleaning by plasma irradiation shall now be described with reference to FIG. 5(A). A plasma cleaner 30 has an upper electrode 31, which is disposed inside a sealed container 34, and a lower electrode 31, which is disposed opposite upper electrode 31 and on which conductive foil 10 is placed. An inlet 35 for supplying gas into the container and an outlet 36 for exhaust the gas are also provided. One of either upper electrode 31 or lower electrode 32 is connected to a high-frequency power supply and the electrode that is not connected to the power supply is grounded.

For plasma cleaning for removal of contaminants on the top surface of the conductive foil, there are the two types of methods of chemical etching and physical etching. Chemical etching methods include the DP (Direct Plasma) and PE (Plasma Etching) methods and oxygen may be used as the gas. Physical-chemical etching methods include the RIE (Reactive Ion Etching) method and argon, neon, or helium may be used as the gas. With chemical etching, organic contaminants can be removed by the use of chemical effects, and with physical etching, organic and inorganic contaminants can be removed by the sputter effect. Either type of method may be used with the present embodiment.

The details of cleaning by plasma shall now be described with reference to FIG. 5(B). With this embodiment, plasma is irradiated across the entirety of conductive foil 10. Specifically, the ions in a plasma 33, generated by discharge, are made to collide across the entirety of the top surface of conductive foil 10. Ions thus collide with the top surfaces of conductive patterns 21 as well as with separation grooves 11, circuit elements 22, and metal wires 25 and the organic or inorganic contaminants attached to these surfaces are thereby removed.

Residues of the etchant used in the etching step, dust in the air, and other contaminants are attached to the side surfaces of separation grooves 11, and these contaminants are also removed by plasma cleaning. Also, since separation grooves 11 are formed by etching, the side surfaces thereof are curved surfaces. Since ions that have entered from above are thus reflected by the side surfaces of separation grooves 11, a single ion collides with the side surfaces of a separation groove 11 several times. Since the effect of surface cleaning by ions is thus large at the side surfaces of separation grooves 11, the organic and inorganic contaminants attached to the side surfaces of separation grooves 11 become removed.

Also, the respective conductive patterns 21 are patterned by forming shallow separation grooves 11 in conductive foil 10, which is a single sheet of metal foil, and are thus connected integrally. Since the respective conductive patterns 21 are thus held in the state of conductive foil 10 that is integral in electrical terms as well, the generation of potential differences due to the respective conductive patterns will be restrained even under the influence of plasma. Thus even if semiconductor element 22A is a CMOS, etc., which undergoes voltage breakdown readily, the damage to semiconductor element 22 can be restrained to the minimum.

Furthermore, the side surfaces of separation grooves 11 are roughened by the plasma cleaning. The adhesion of sealing resin 28, which is formed in a subsequent step, to the side surfaces of separation grooves 11 is thus improved. Here, since the side surfaces of separation grooves 11 are the side surfaces of conductive patterns 21, the adhesion of conductive patterns 21 to sealing resin 28 is improved and peeling, etc., of conductive patterns 21 can be prevented.

Furthermore, though conductive patterns 21 are heated by the plasma cleaning, since conductive patterns 21 are integral as conductive foil 10, localized thermal expansion and deformation of conductive patterns 21 will be prevented. Bending and disconnection of metal wires 25 due to expansion or deformation of conductive patterns 21 can thus be prevented.

Furthermore, by mixing oxygen in the gas for performing plasma cleaning, the top surface of conductive foil 10 can be oxidized. By thus oxidizing the top surface, the force of adhesion of sealing resin 25 to conductive patterns 21 can be improved further.

Figure 5C:
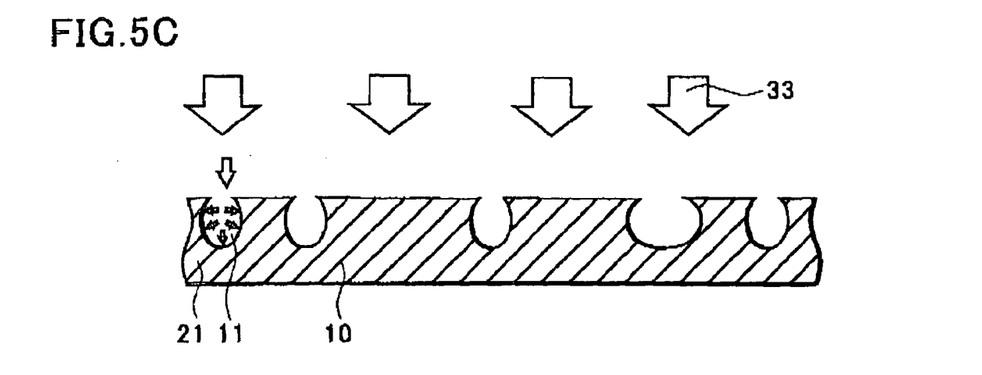

Though in the above description of this step, plasma irradiation is carried out on conductive foil 10 on which circuit elements 22 have been mounted, plasma irradiation may also be carried out on conductive foil 10 prior to the mounting of circuit elements 22 as shown in FIG. 5(C). By performing plasma irradiation in the condition in which circuit elements 22 are not mounted, plasma can be irradiated across the entire top surface of conductive foil 10. That is, in the illustrated condition, there is nothing that blocks the plasma irradiation between upper electrode 31 and the top surface and separation grooves 11 of conductive foil 10 onto which plasma irradiation is performed. Plasma irradiation is thus performed in an overall manner on the top surface and separation grooves 11 of conductive foil 10, thus accomplishing removal of contaminants from these surfaces and roughening of these surfaces.

Figure 6A:
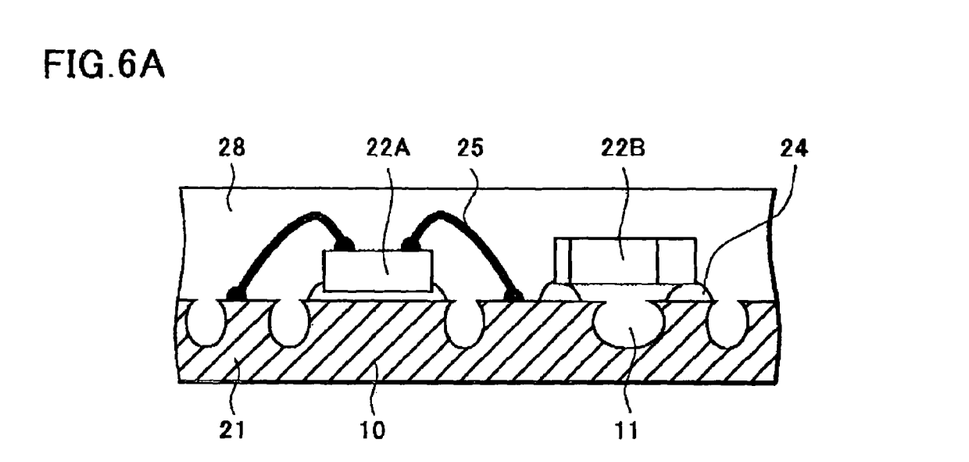
Figure 6B:
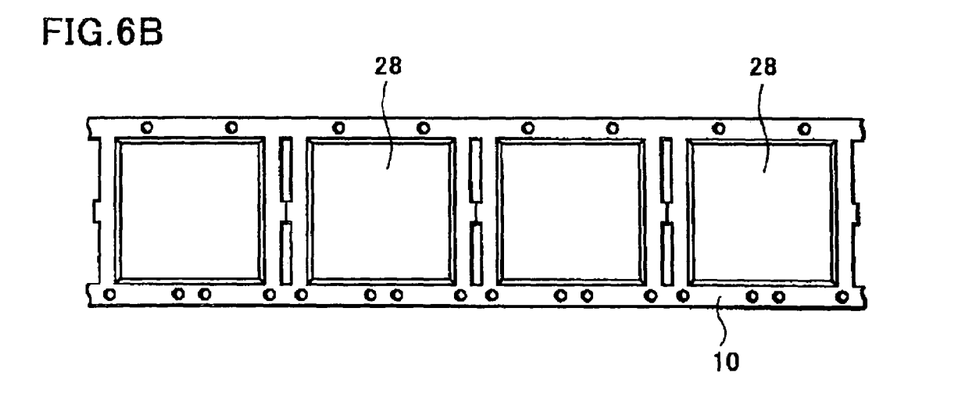

In the fourth step of this embodiment, sealing with a sealing resin 28 is carried out so as to cover circuit elements 22 and fill separation grooves 11 as shown in FIG. 6.

The state after resin sealing shall now be described with reference to FIG. 6(A). Sealing resin 28 covers circuit elements 22 and the plurality of conductive patterns 21, and separation grooves 11 between conductive patterns 21 are filled with sealing resin 28, which fits and binds strongly with the curved structures of the side surfaces of the respective conductive patterns 21. Conductive patterns 21 are thus supported by sealing resin 28. Also in this step, transfer molding using an epoxy resin or other thermosetting resin may be carried out. The merit of this step is that until being covered by sealing resin 28, conductive foil 10, which is to become conductive patterns 21, serves as a supporting substrate. The merit of enabling work to be performed while eliminating component materials as much as possible is provided and cost reduction can also be realized.

Figure 7:
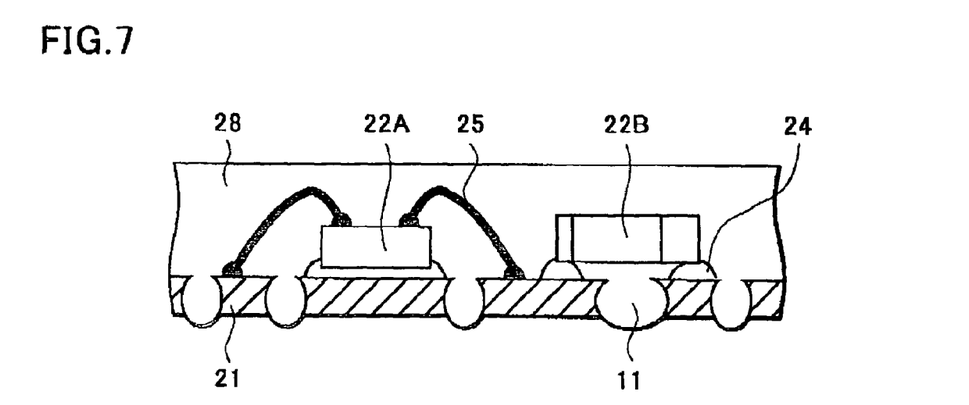
FIG. 7 is a sectional view showing a circuit device manufacturing method of preferred embodiment.

Referring to FIG. 7, conductive foil 10 is removed at the thickness parts at which separation grooves 11 are not provided to electrically separate the respective conductive patterns 21. Specifically, of the thickness parts of block 12 of conductive foil 10 at which separation grooves 11 are not provided, at least the regions at which conductive patterns 21 are provided are eliminated. This separation is carried out on regions of conductive foil 10 at which the conductive patterns inside block 12 have been formed. In this step, the rear surface of conductive foil 10 is etched in an overall manner until sealing resin 28 becomes exposed as shown in FIG. 7. As a result, a structure in which the rear surfaces of conductive patterns 21 are exposed on sealing resin 28 is realized.

Figure 8:
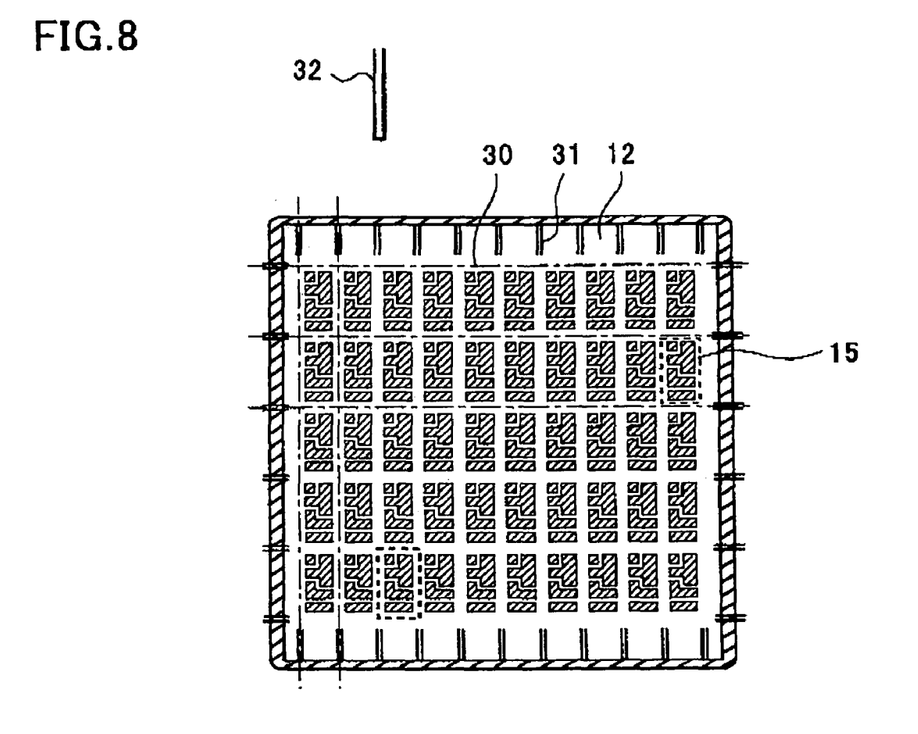
FIG. 8 is a plan view showing a circuit device manufacturing method of preferred embodiment.

In the fifth step of this embodiment, sealing resin 28 of block 12 is separated by dicing according to the respective mounting parts 15.

In this step, a plurality of blocks 12, adhered onto an adhesive sheet, are sucked by vacuum onto a setting base of a dicing device, and sealing resin 28 at separation grooves 11 is diced by a dicing blade 32 along dicing lines 30 between the respective mounting parts 15 to carry out separation into individual circuit devices.

Figure 9:
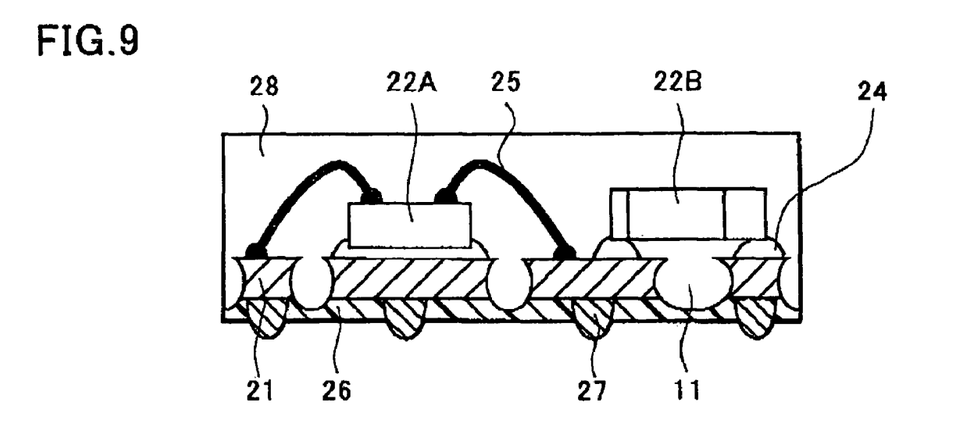
FIG. 9 is a sectional view showing a circuit device manufacturing method of preferred embodiment.

The configuration of a circuit device manufactured by the above-described steps shall now be described with reference to FIG. 9. The circuit device shown in this figure comprises conductive patterns 21, circuit elements 22, affixed onto conductive patterns 21, metal wires 25, electrically connecting a semiconductor element 22A with conductive patterns 21, and a sealing resin 28, supporting and sealing the entirety while exposing the rear surfaces of conductive patterns 21. Conductive patterns 21 that are exposed from the rear surface of sealing resin 28 are covered by a resist 26, and external electrodes 27, formed of soft solder or other solder material, are formed at desired locations.

This circuit device manufacturing method of embodiment provides the following effects.

Firstly, since plasma irradiation is performed on the top surface of conductive foil 10, in which separation grooves 11 that separate conductive patterns 21 have been formed, contaminants attached to the top surface can be removed and the top surface can be roughened. The adhesion of conductive patterns 21 to sealing resin 28 can thereby be improved.

Secondly, by performing plasma irradiation prior to the mounting of circuit elements 22, plasma irradiation of the top surface and separation grooves 11 of conductive foil 10 can be performed in an overall manner, thereby enabling further improvement of the effects of contaminant removal and top surface roughening.

Thirdly, plasma irradiation may also be carried out after the mounting of circuit elements 22. Since plasma cleaning is performed in a state in which conductive patterns 21 are electrically integral as conductive foil 10, the generation of localized electric potential differences in conductive patterns 21 due to the influence of plasma can be restrained. Damage to semiconductor elements 22, due to the electric potential differences generated by the influence of plasma, can thus be restrained. Cleaning and roughening of the top surfaces of electric wires 25 and circuit elements 22 can also be performed.

Fourthly, since ions that enter from above conductive foil 10 are reflected by the side surfaces of separation grooves 11, the effect of contaminant removal by plasma irradiation can be improved further.

Fifthly, since the side surfaces of separation grooves 11 can be roughened by the plasma, the adhesion of sealing resin 28 to conductive patterns 21 can be improved further.

Sixthly, since matter attached to the surfaces of separation grooves 11 can be removed by plasma irradiation, attached matter will not exist on the exposed surface of sealing resin 28 that fills separation grooves 11 and is exposed at the rear surface. The strength of attachment of resist 26 to sealing resin 28, which is exposed from separation grooves 11, can thus be increased.

What is claimed is:

1. A circuit device manufacturing method comprising:
   forming separation grooves in a conductive foil from a top surface to form conductive patterns that are integrally connected at the bottom portion of the conductive foil;
   mounting a circuit element onto one or more of the conductive patterns;
   sealing with a resin layer so as to cover the circuit element and fill the separation grooves; and
   covering a portion of the resin layer, which is exposed from intervals separating the conductive patterns, with a resist,
   wherein plasma is irradiated onto the top surface of the conductive foil, and
   wherein a rear surface of the conductive foil is eliminated until the resin layer is exposed at the rear surface of the conductive foil to electrically separate the respective conductive patterns, and
   wherein contaminants attached to side surfaces of the separation grooves are removed by ions reflected by the side surfaces.

2. A circuit device manufacturing method comprising:
   forming separation grooves in a conductive foil from a top surface to form conductive patterns that are integrally connected at the bottom portion of the conductive foil;
   mounting a circuit element onto one or more of the conductive patterns;
   irradiating plasma onto the top surface of the conductive foil, including the circuit element;
   sealing with a resin layer so as to cover the circuit element and fill the separation grooves; and
   covering a portion of the resin layer, which is exposed from intervals separating the conductive patterns, with a resist,
   wherein a rear surface of the conductive foil is eliminated until the resin layer is exposed at the rear surface of the conductive foil to electrically separate the respective conductive patterns, and
   wherein contaminants attached to side surfaces of the separation grooves are removed by ions reflected by the side surfaces.

3. The method of claim 1, wherein irradiation of the plasma is carried out prior to the step of mounting the circuit element.

4. The method of claim 1, wherein irradiation of the plasma is carried out subsequent to the step of mounting the circuit element.

5. The method of claim 1 or 2, wherein contaminants attached to the surfaces of the separation grooves are removed by the plasma.

6. The method of claim 5, wherein the contaminants comprise organic or inorganic matter.

7. The method of claim 1 or 2, wherein the surface of the separation grooves are roughened by the plasma irradiation.

8. The method of claim 1 or 2, wherein the surface of the separation grooves are oxidized by the plasma irradiation.

9. The method of claim 1 or 2, wherein the plasma irradiation is carried out using oxygen gas.

10. The method of claim 1 or 2, wherein the plasma irradiation is carried out using an inert gas.

11. The method of claim 1 or 2, wherein the conductive foil is formed of a metal having copper as the principal material.

12. The method of claim 1 or 2, wherein the circuit element comprises a semiconductor element that is electrically connected to one or more of the conductive patterns via metal wires.

13. The method of claim 1 wherein the separation grooves extend only partially through the conductive foil.

* * * * *